United States Patent
Hayakawa et al.

(10) Patent No.: US 6,881,799 B2
(45) Date of Patent: Apr. 19, 2005

(54) CURING AGENT FOR EPOXY RESINS AND EPOXY RESIN COMPOSITION

(75) Inventors: Atsuhito Hayakawa, Yokkaichi (JP); Yasuyuki Murata, Yokkaichi (JP)

(73) Assignee: Resolution Performance Products LLC, Houston, TX (US)

( * ) Notice: Subject to any disclaimer, the term of this patent is extended or adjusted under 35 U.S.C. 154(b) by 0 days.

(21) Appl. No.: 10/250,612

(22) PCT Filed: Jan. 9, 2002

(86) PCT No.: PCT/NL02/00009

§ 371 (c)(1), (2), (4) Date: Jul. 7, 2003

(87) PCT Pub. No.: WO02/057361

PCT Pub. Date: Jul. 25, 2002

(65) Prior Publication Data

US 2004/0054119 A1 Mar. 18, 2004

(30) Foreign Application Priority Data

Jan. 19, 2001 (JP) .......................... 2001-047382
Jan. 19, 2001 (JP) .......................... 2001-047383

(51) Int. Cl.$^7$ .......................... C08L 61/14; C08L 63/00; C08L 63/04
(52) U.S. Cl. .......................... 525/505; 525/485
(58) Field of Search .................................. 525/485, 505

(56) References Cited

U.S. PATENT DOCUMENTS 5,432,240 A  *  7/1995  Tsumura et al. ............. 525/398
6,034,210 A  *  3/2000  Tashima et al. ............. 530/203

FOREIGN PATENT DOCUMENTS

| EP | 0598302 | | 5/1994 |
| EP | 1055690 A | | 11/2000 |
| JP | 05039439 A | | 2/1993 |
| JP | 6145306 A | | 5/1994 |
| JP | 06145306 A | * | 5/1994 |
| JP | 08253551 A | | 10/1996 |

OTHER PUBLICATIONS

Chemical abstracts registry No. 2043–61–0 for cyclohexanecarboxaldehyde, 1967.*

* cited by examiner

Primary Examiner—Robert Sellers

(57) ABSTRACT

A curing agent for epoxy resins, comprising (a) 30 to 99 parts by weight of (i) a modified phenol resin, which is obtained by polycondensation of a heavy oil or pitch, a phenol and an aldehyde compound in the present of an acid catalyst, and/or of (ii) a a phenol resin having a hydrocarbon group with small polarity between phenol nuclei represented by the following general formula (I): wherein $R^1$'s may be the same or different from each other and each represent an alkyl group having 1 to 10 carbon atoms, substituted or nonsubstituted phenyl group, substituted or nonsubstituted aralkyl group or alkoxy group; Z's may be the same or different from each other and each represent a divalent hydrocarbon group having 1 to 20 carbon atoms to which a nitrogen atom, oxygen atom, phosphorus atom or sulfur atom may be bonded, at least one Z in one molecule is a divalent hydrocarbon group having 5 to 20 carbon atoms to which a nitrogen atom, oxygen atom, phosphorus atom or sulfur atom may be bonded; n is a number of 0 to 8 as an average value; and p's may be the same or different from each other and each represent an integer of 0 to 3, (b) 1 to 70 parts by weight of a thiodiphenol compound represented by the following general formula (II): wherein $R^1$'s may be the same or different from each other and each represent an alkyl group having 1 to 12 carbon atoms, substituted or nonsubstituted phenyl group, substituted or nonsubstituted aralkyl group or alkoxy group, and p's may be the same or different from each other and each represent an integer of 0 to 3, and (c) 0 to 100 parts by weight of a polyhydric phenol compound having a structure other than the components (a) and (b), and epoxy resin composition comprising them, in particular to be used for semiconductor encapsulation

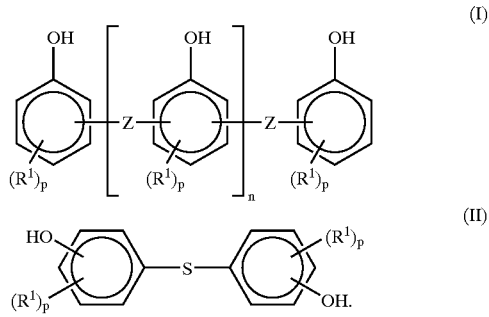

7 Claims, No Drawings

CURING AGENT FOR EPOXY RESINS AND EPOXY RESIN COMPOSITION

The present invention relates to a curing agent for epoxy resins which has a low melt viscosity, superior low moisture absorption and low stress properties and provides a cured product with excellent moldability, an epoxy resin composition comprising the same, and an epoxy resin composition for semiconductor encapsulation comprising the same.

Epoxy resins are used in a wide variety of fields due to its excellent curing properties and handling ease. Various kinds of curing agents can be used for the epoxy resins and these curing agents are used for different application purposes because curing properties greatly vary according to the type of the selected curing agent.

In recent years, higher characteristic properties have been required of polymer materials as the use conditions of the polymer materials become more severe. Even in the field where a curing agent for epoxy resins is used, generally used curing agents cannot fully satisfy required characteristic properties.

For example, an epoxy resin composition comprising a novolak type phenol resin as a curing agent is used for semiconductor encapsulation. Also in this field, requirements are becoming higher and higher. That is, the integration of semiconductor devices is becoming higher, semiconductor chips are becoming larger, packages are becoming smaller and thinner, and the mounting system is shifting to surface mounting. In this case, since an entire semiconductor device is exposed to a high temperature close to the melting temperature of a solder at the time of packaging, great stress is generated in the entire package due to the rapid expansion of water absorbed by the package, whereby the package is cracked. Low moisture absorption and low stress properties, that is, a low modulus, are required of an epoxy resin and a curing agent for encapsulation usage which have excellent solder cracking resistance.

Although low moisture absorption and low stress properties, that is, thermal expansion coefficient is generally improved by filling a large amount of an inorganic filler such as molten silica powders, when a large amount of an inorganic filler is filled, fluidity at the time of molding is impaired. Therefore, a low melt viscosity is also required of an epoxy resin and a curing agent for encapsulation usage.

It cannot be said that a combination of a cresol novolak type epoxy resin and a phenol novolak resin curing agent which are now mainly used are satisfactory in terms of low moisture absorption and low stress properties, that is, low elastic modulus and low melt viscosity.

To solve these problems, a dicyclopentadiene phenol resin or phenol resin having a hydrocarbon carbon group with small polarity introduced between the phenol nuclei, such as a xylylene phenol resin is used as a curing agent to improve low moisture absorption and low stress properties. However, these phenol resins have a high melt viscosity, thereby making it impossible to fill a large amount of an inorganic filler. If the molecular weight of these resins is lowered to reduce melt viscosity, moldability deteriorates due to lowered curability, resulting in reduced productivity. The amount of a curing promoting agent can be increased to improve curability. However, as the storage stability of an encapsulation material deteriorates in this case, it is not practical.

It is an object of the present invention to provide a curing agent for epoxy resins which has a low melt viscosity and excellent low stress and low moisture absorption properties and provides a cured product having excellent moldability; an epoxy resin composition which gives a cured product, having a low melt viscosity, excellent low moisture absorption and low stress properties, and to provide a cured product having excellent moldability in using the above curing agent; and an epoxy resin composition for semiconductor encapsulation usage.

As result of extensive research and experimentation, it has now surprisingly found that the above objective can be attained by using a phenol resin having a specific hydrocarbon group with small polarity between the phenol nuclei or a modified phenol resin, obtainable by polycondensation of a heavy oil or pitch, a phenol and an aldehyde compound in the presence of an acid catalyst, and a thiodiphenol compound as curing agents for epoxy resins.

Accordingly, the present invention relates to a curing agent for epoxy resins, comprising (a) 30 to 99 parts by weight of (i) a modified phenol resin which is obtained by polycondensation of a heavy oil or pitch, a phenol and an aldehyde compound in the present of an acid catalyst, and/or of (ii) a a phenol resin having a hydrocarbon group with small polarity between phenol nuclei represented by the following general formula (I):

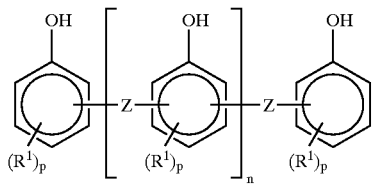

wherein $R^1$'s may be the same or different from each other and each represent an alkyl group having 1 to 10 carbon atoms, substituted or nonsubstituted phenyl group, substituted or nonsubstituted aralkyl group or alkoxy group; Z's may be the same or different from each other and each represent a divalent hydrocarbon group having 1 to 20 carbon atoms to which a nitrogen atom, oxygen atom, phosphorus atom or sulfur atom may be bonded, at least one Z in one molecule is a divalent hydrocarbon group having 5 to 20 carbon atoms to which a nitrogen atom, oxygen atom, phosphorus atom or sulfur atom may be bonded; n is a number of 0 to 8 as an average value; and p's may be the same or different from each other and each represent an integer of 0 to 3, (b) 1 to 70 parts by weight of a thiodiphenol compound represented by the following general formula (II):

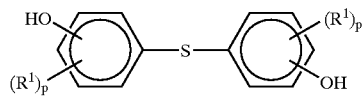

wherein $R^1$'s may be the same or different from each other and each represent an alkyl group having 1 to 12 carbon atoms, substituted or nonsubstituted phenyl group, substituted or nonsubstituted aralkyl group or alkoxy group, and p's may be the same or different from each other and each represent an integer of 0 to 3, and (c) 0 to 100 parts by weight of a polyhydric phenol compound having a structure other than the components (a) and (b). More in particular the present invention relates to a curing agent for epoxy resins comprising:

30 to 99 parts by weight of a phenol resin having a hydrocarbon group with small polarity between the phenol nuclei represented by the following general formula (I):

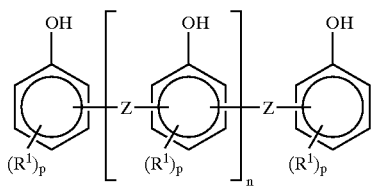

wherein $R^1$ may be the same or different from each other and each represent an alkyl group having 1 to 10 carbon atoms, substituted or nonsubstituted phenyl group, substituted or nonsubstituted aralkyl group or alkoxy group, Z's may be the same or different from each other and each represent a divalent hydrocarbon group having 1 to 20 carbon atoms to which a nitrogen atom, oxygen atom, phosphorous atom or sulfur atom may be bonded, at least one Z in one molecule is a divalent hydrocarbon group having 5 to 20 carbon atoms to which a nitrogen atom, oxygen atom, phosphorus atom or sulfur atom may be bonded, n is a number of 0 to 8 as an average value, and p's may be the same or different from each other and each an integer of 0 to 3, (b) 1 to 70 parts by weight of a thiodiphenol compound represented by the following general formula (II):

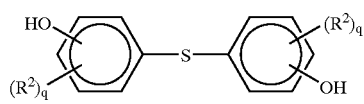

wherein $R^2$'s may be the same or different and each an alkyl group having 1 to 12 carbon atoms, substituted or nonsubstituted phenyl group, substituted or nonsubstituted aralkyl group or alkoxy group, and q's may be the same or different and each an integer of 0 to 3, and (c) 0 to 100 parts by weight of a polyhydric phenol compound having a structure other than the components (a) and (b).

More preferred curing agents of this type are characterized in that at least one phenol resin selected from phenol resins of the general formula (I) in which at least one Z in one molecule has a skeleton of the following general formulae.

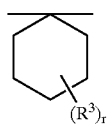

(III)

(IV)

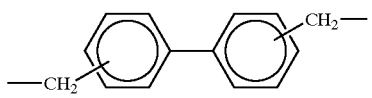

(V)

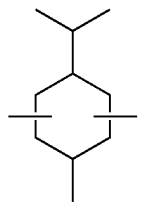

(VI)

wherein $R^3$ is an alkyl group having 1 to 12 carbon atoms, substituted or nonsubstituted phenyl group, substituted or nonsubstituted aralkyl group or alkoxy group, the total number of carbon atoms of $R^3$'s is 1 to 14, and r is an integer of 0 to 10, is used as the phenol resin having a hydrocarbon group with small polarity between the phenol nuclei (a).

According to preferred embodiment of the hereinbefore specified group of curing agents, at least one thiodiphenol selected from bis(4-hydroxyphenyl) sulfide, bis(4-hydroxy-3-methylphenyl)sulfide and bis(4-hydroxy-3,5-dimethylphenyl)sulfide is used as the thiodiphenol compound (b).

More preferred embodiments of the hereinbefore specified group of curing agents, comprise (a) 45 to 90 parts by weight of a phenol resin having a hydrocarbon group with small polarity between the phenol nuclei, (b) 10 to 55 parts by weight of a thiodiphenol compound, and (c) 0 to 100 parts by weight of a polyhydric phenol compound having a structure other than the components (a) and (b).

It will be appreciated that another specific feature of the present invention is formed by an epoxy resin composition comprising a blend of an epoxy resin and the curing agent for epoxy resins according to any one of the preceeding paragraphs, as essential components.

More in particular said epoxy resin composition for semiconductor encapsulation comprises as essential components at least one phenol compound selected from biphenol, tetramethyl biphenol, bis(4-hydroxyphenyl)methane, bis(4-hydroxyphenyl)propane, terpene phenol and cresol novolak resin, an epoxy resin produced from epihalohydrin and the curing agent for epoxy resins as specified hereinbefore.

Said epoxy resin composition for semiconductor encapsulation comprises in addition crushed and/or spherical molten and/or crystalline silica powders as an inorganic filler in an amount of 80 to 95 wt % based on the composition.

Preferably in the epoxy resin composition for semiconductor encapsulation according to the invention, the amount of the curing agent for epoxy resins is such that the amount of a group which reacts with the epoxy group of the curing agent should be 0.5 to 2.0 mols based on 1 mol of the epoxy group contained in all the epoxy resin components.

As for the amount of each component of the curing agent for epoxy resins of the present invention, the amount of (a) the phenol resin having a hydrocarbon group with small polarity between the phenol nuclei is 30 to 90 parts by weight, the amount of (b) the thiodiphenol compound is 1 to 70 parts by weight and the amount of (c) the polyhydric phenol compound having a structure other than the components (a) and (c) is 0 to 100 parts by weight. The above components of the curing agent for epoxy resins of the present invention may be mixed together to prepare a mixed curing agent beforehand, or may be added separately or simultaneously when the components are mixed together during production of the epoxy resin composition.

When the amount of (a) the phenol resin having a hydrocarbon group with small polarity between the phenol nuclei is smaller than 30 parts by weight, low moisture absorption and low stress properties become unsatisfactory. When the amount of (b) the thiodiphenol compound is smaller than 1 part by weight, curability lowers, thereby making it impossible to obtain sufficient moldability. When the amount is larger than 70 parts by weight, low moisture absorption properties become unsatisfactory. To achieve good balance among the above properties, when the amount of the component (a) is 30 to 99 parts by weight, the amount of the component (b) is 1 to 70 parts by weight. Preferably, the amount of the component (a) is 40 to 95 parts by weight and the amount of the component (b) is 5 to 55 parts by weight. More preferably, the amount of the component (a) is 45 to 90 parts by weight and the amount of the component (b) is 10 to 55 parts by weight.

When the amount of (c) the polyhydric phenol compound having a structure other than the components (a) and (b) is larger than 100 parts by weight, the effect of the present invention cannot be fully obtained.

If (a) the phenol resin having a hydrocarbon group with small polarity between the phenol nuclei represented by the above general formula (I) which is one of the components of the curing agent for epoxy resins of the present invention has a structure represented by the above general formula (I), its production process is not particularly limited. An addition condensation reaction between a phenol compound and a carbonyl compound, an addition reaction between a phenol compound and a diene compound, or a condensation reaction between a phenol compound and a compound having a dihydroxyalkyl group or dialkoxyalkyl group is generally carried out to oligomerize the phenol compound so as to obtain the phenol resin.

Examples of the phenol compound used herein include phenol, cresol, xylenol, ethylphenol, propylphenol, butylphenol, butylcresol, phenylphenol, benzylphenol, methoxyphenol and bromophenol.

The compound having a carbonyl group used to oligomerize the phenol compound is an aldehyde having 5 to 15 carbon atoms or ketone, as exemplified by enzaldehyde cyciohexane carboxaldehyde, octanal, cycohexanone and acetophenone.

When the curing agent having the above composition is used, a good cured product is obtained and is preferred especially for semiconductor encapsulation usage.

Examples of the diene compound include divinylbenzene, norbornene, diisopropenyl benzene and terpenes.

Examples of the compound having a dihydroxyalkyl group or dialkoxyalkyl group include 4,4'-dihydroxymethylbiphenyl, 2,6-dihydroxymethylnaphthalene, 4,4'-dimethoxymethylbiphenyl and 2,6-dimethoxynaphthalene.

The reaction between the phenol compound and the carbonyl compound, diene compound or compound having a dihydroxyalkyl group or dialkoxyalkyl group to oligomerize the phenol compound so as to obtain a phenol resin is a general reaction. That is, the reaction is carried out at 20 to 200° C. for 30 minutes to 20 hours in the presence of an acid catalyst. To adjust the molecular weight of (a) the phenol resin having a hydrocarbon group with small polarity between the phenol nuclei for the above reaction, the amount of the phenol compound is 1 to 20 mols based on 1 mol of the carbonyl compound, diene compound or compound having a dihydroxyalkyl group or dialkoxyalkyl group. The molecular weight can also be adjusted by the recrystallization, reprecipitation, extraction or distillation of the formed phenol resin.

The softening point and melt viscosity of the obtained phenol resin can be re-adjusted by carrying out a condensation reaction between the obtained phenol resin and an aldehyde such as formaldehyde or acetaldehyde under acidic conditions.

Out of phenol resins having a hydrocarbon group with small polarity between the phenol nuclei, resins represented by the following formulas (VII) to (X)

VII

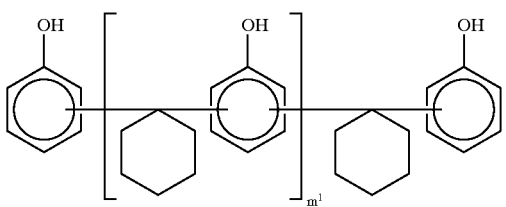

wherein $m^1$ is a number of 0 to 8 as an average value;

VIII

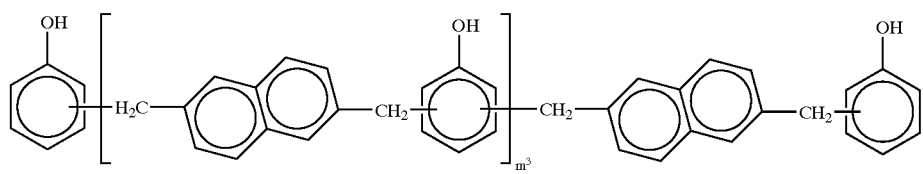

wherein $m^2$ is a number of 0 to 8 as average value;

IX

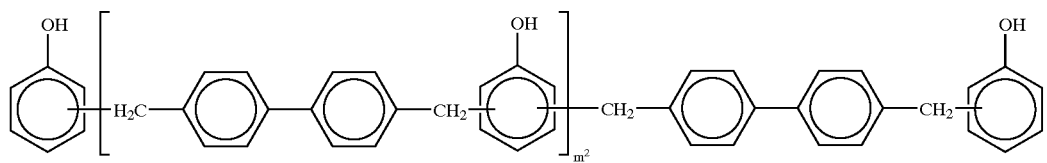

wherein $m^3$ is a number of 0 to 8 as an average value.

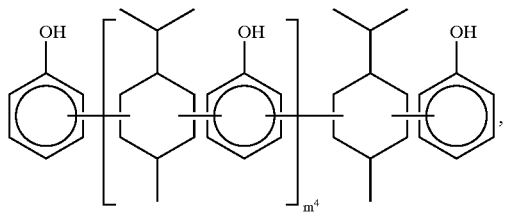

wherein $m^4$ is a number of 0 to 8 as an average value) are preferred in respect of availability and curing properties.

Any thiodiphenol compound according to formula II alone or mixed with others may be used as component(b) of the curing agent for epoxy resins of the present invention. Examples of the components (b) according to formula (II), are bis(4-hydroxyphenyl)sulfide, bis(2-hydroxyphenyl)sulfide, 2-hydroxyphenyl-4'-hydroxyphenylsulfide, bis(4-hydroxy-3-methylphenyl)sulfide, bis(4-hydroxy-3,5-dimethylphenyl)sulfide, bis(4-hydroxy-2-methyl-5-tert-butylphenyl)sulfide, bis(4-hydroxy-3-methyl-5-tert-butylphenyl)sulfide and bis(4-hydroxy-3,5-di-tert-butylphenyl)sulfide. Bis(4-hydroxyphenyl)sulfide, bis(4-hydroxy-3-methylphenyl)sulfide and bis(4-hydroxy-3,5-dimethylphenyl)sulfide are preferred and bis(4-hydroxyphenyl)sulfide is more preferred from the viewpoints of easy acquisition and curing properties.

To finely adjust the characteristic properties of the curing agent, (c) the polyhydric phenol compound having a structure other than the components (a) and (b) may be mixed with the curing agent for epoxy resins of the present invention.

Examples of the polyhydric phenol compound include phenol resins such as phenol novolak resins, cresol novolak resins and bisphenol A novolak resins, and polyhydric phenol resins obtained by carrying out a condensation reaction between a phenol and an aldehyde such as acetaldehyde or propionaldehyde.

Another aspect of the present invention is informed by curing agents for epoxy resins, comprising:
(a) 30 to 99 parts by weight of a modified phenol resin which is obtained by polycondensing a heavy oil or pitch, a phenol and an aldehyde compound in the presence of an acid catalyst,
(b) 1 to 70 parts by weight of a thiodiphenol compound represented by the following general formula (I):

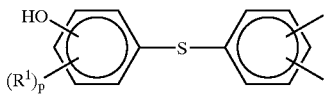

wherein $R^1$'s may be the same or different from each other and each represent an alkyl group having 1 to 12 carbon atoms, substituted or nonsubstituted phenyl group, substituted or nonsubstituted aralkyl group or alkoxy group, and p's may be the same or different from each other and each represent an integer of 0 to 3, and (c) 0 to 100 parts by weight of a polyhydric phenol compound having a structure other than the components (a) and (b).

More in particular such curing agents for epoxy resins are characterized in that the modified phenol resin as the component (a) is obtained by mixing together a heavy oil or pitch, 0.3 to 10 mols of the phenol, 0.2 to 9 mols of the aldehyde compound and 0.01 to 3 mols of the acid catalyst based on 1 mol of the heavy oil or pitch calculated from its average molecular weight and heating to carry out a polycondensation reaction.

Preferably in the hereinbefore specified curing agents the heavy oil or pitch has an aromatic hydrocarbon fraction fa of 0.40 to 0.95 and an aromatic ring hydrogen content Ha of 20 to 80%.

More preferably in the curing agent, the heavy oil has a distillation start temperature of 170° C. or more.

Most preferably the modified phenol resin (a) has a hydroxyl group equivalent of 130 to 200 g/eq.

Preferably in said curing agents for epoxy resins at least one thiodiphenol is selected from bis (4-hydroxyphenyl) sulfide, bis (4-hydroxy-3-methylphenyl) sulfide and bis(4-hydroxy-3,5-dimethylphenyl)sulfide is used as the thiodiphenol compound (b).

It will be appreciated that another feature of the present invention is formed by epoxy resin compositions comprising as essential components and epoxy resin and the curing agent-for epoxy resins according to the hereinbefore specified type.

According to one preferred embodiment, the epoxy resin composition for semiconductor encapsulation comprises as essential components at least one phenol compound selected from biphenol, tetramethylbiphenol, bis(4-hydroxyphenyl)methane, bis(4-hydroxyphenyl)propane, terpenediphenol and cresol novolak resin, an epoxy resin produced from epihalohydrin and the curing agent for epoxy resins as specified hereinbefore.

More preferably the epoxy resin composition for semiconductor encapsulation comprises as essential components an epoxy resin, the curing agent for epoxy resins as specified hereinbefore, and crushed and/or spherical molten and/or crystalline silica powders as an inorganic filler in an amount of 80 to 95 wt % based on the composition.

Most preferably in the epoxy resin composition for semiconductor encapsulation, the amount of the curing agent for epoxy resins according to is such that the amount of a group which reacts with the epoxy group of the curing agent should be 0.5 to 2.0 mols based on 1 mol of the epoxy group contained in all the epoxy resin components.

In general, for both hereinbefore specified types of curing agents in the epoxy resin compositions of the present invention, examples of the epoxy resin include epoxy resins produced from epihalohydrin and a phenol such as bisphenol F, bisphenol AD, biphenol, tetramethylbiphenol, bis(4-hydroxyphenyl)methane, bis(4-hydroxyphenyl)propane, terpenediphenol, hydroquinone, methylhydroquinone, dibutylhydroquinone, resorcin, methylresorcin, bisphenol S, thiodiphenol, dihydroxydiphenyl ether, dihydroxynaphthalene, phenol novolak resin, cresol novolak resin, bisphenol A novolak resin, dicyclopentadiene phenol resin, terpene phenol resin, phenol aralkyl resin or naphthol novolak resin; phenol compound such as a polyhydric phenol resin obtained from a condensation reaction between a phenol and an aldehyde such as hydroxybenzaldehyde, crotonaldehyde or glyoxal, or modified phenol resin obtained by polycondensing a petroleum-based heavy oil or pitch, formaldehyde polymer and phenol in the presence of an acid catalyst; epoxy resins produced from an amine compound such as diaminodiphenyl methane or xylene diamine and epihalohydrin; and epoxy resins produced from a carboxylic acid such as methylhexahydrophthalic acid or dimeric acid and epihalohydrin.

An epoxy resin produced from at least one phenol compound selected from biphenol, tetramethylbiphenol, bis(4-hydroxyphenyl)methane, bis(4-hydroxyphenyl)propane, terpenediphenol and cresol novolak resin and epihalohydrin is preferably used as the epoxy resin of the epoxy resin composition for semiconductor encapsulation of the present invention.

The amount of the curing agent for epoxy resins is such that the group which reacts with epoxy in the curing agent should be 0.5 to 2.0 mols, preferably 0.7 to 1.2 mols based on 1 mol of the epoxy group contained in all epoxy resin components.

Various additives may be mixed with the epoxy resin composition of the present invention, like with other general epoxy resin compositions. The additives include a curing accelerator, inorganic filler, coupling agent, flame retardant, plasticizer, reactive diluent and pigment, and may be suitably mixed as required.

Various additives may be mixed with the epoxy resin composition of the present invention, like with other general epoxy resin compositions. The additives include a curing accelerator, inorganic filler, coupling agent, flame retardant, plasticizer, reactive diluent and pigment, and may be suitably mixed as required.

Examples of the curing accelerator include phosphine compounds such as tributyl phosphine, triphenyl phosphine, tris(dimethoxyphenyl)phosphine, tris(hydroxypropyl) phosphine and tris(cyanoethyl)phosphine; phosphonium salts such as tetraphenylphosphonium tetraphenyl borate, methyltributylphosphonium tetraphenyl borate and methyltricyanoethylphosphonium tetraphenyl borate; imidazoles such as 2-methylimidazole, 2-phenylimidazole, 2-ethyl-4-methylimidazole, 2-undecylimidazole, 1-cyanoethyl-2-methylimidazole, 2,4-dicyano-6-[2-methylimidazolyl-(1)]-ethyl-S-triazine and 2,4-dicyano-6-[2-undecylimidazolyl-(1)]-ethyl-S-triazine; imidazolium salts such as 1-cyanoethyl-2-undecylimidazolium trimellitate, 2-methylimidazolium isocyanurate, 2-ethyl-4-methylimidazolium tetraphenylborate and 2-ethyl-1,4-dimethylimidazolium tetraphenylborate; amines such as 2,4,6-tris(dimethylaminomethyl)phenol, benzyldimethylamine, tetramethylbutylguanidine, N-methylpiperazine and 2-dimethylamino-1-pyrroline; ammonium salts such as triethylammonium tetraphenylborate; diazabicyclo compounds such as 1,5-diazabicyclo(5,4,0)-7-undecene, 1,5-diazabicyclo(4,3,0)-5-nonene and 1,4-diazabicyclo(2,2,2)-octane; tetraphenylborates, phenol salts, phenol novolak salts and 2-ethylhexanic acid salts and the like of these diazabicyclo compounds.

Out of these curing accelerator compounds, phosphine compounds, imidazole compounds, diazabicyclo compounds and salts thereof are preferred.

Examples of the filler include fused silica, crystalline silica, glass powder, alumina and calcium carbonate. The epoxy resin composition for semiconductor encapsulation of the present invention preferably contains, as an inorganic filler, a crushed and/or spherical, molten and/or crystalline silica powder filler in an amount of 80 to 95 wt % based on the composition.

Examples of the flame retardant include halogen-based flame retardants such as brominated epoxy resins and brominated phenol resins; antimony compounds such as antimony trioxide; phosphorus-based flame retardants such as phosphate esters and phosphines; nitrogen-based flame retardants such as melamine derivatives and inorganic flame retardants such as aluminum hydroxide and magnesium hydroxide.

However, it is desired these days that the above flame retardants should not be mixed from the viewpoint of deterioration in characteristic properties and environmental protection. Since the cured product of the epoxy resin composition for semiconductor encapsulation of the present invention has excellent flame retardancy, the flame retardant does not need to be mixed or may be mixed in a small amount.

The curing agent for epoxy resins of the present invention has a low melt viscosity and excellent low moisture absorption and low stress properties and provides a cured product having excellent moldability. Further, as the epoxy resin composition of the present invention which comprises the curing agent has a low melt viscosity and excellent low moisture absorption and low stress properties and provides a cured product having excellent moldability, it can be advantageously used for such application as adhesion, casting, sealing, lamination and coating and especially useful for semiconductor encapsulation.

It is true that from JP 6-145306 an epoxy resin composition was known, which was based on an epoxy resin and a curing agent and excellent in curability, adhesion and workability, said curing agent comprising 5 to 50% by weight based on the total curing agent of a thiodipehnol represented by the following formula (I):

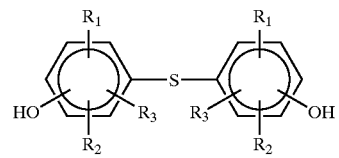

Wherein $R_1$, $R_2$ and $R_3$ are independently hydrogen atom, halogen atom, alkyl group containing 1 to 12 carbon atoms, aryl group, aralkyl group, cycloalkyl group, alkoxy group or hydroxyl group.

However, it will be appreciated that in the prescribed thiodiphenol curing agent component, the substituents $R_1$, $R_2$ and $R_3$ were specified to also represent hydrogen, halogen and hydroxylgroups.

Said JP6-145306 did not disclose or teach the Co application of very specifically structured modified phenol resin in the curing agent, in order to reach the presently found improved combination of physical properties of the complete epoxy resin compositions, comprising said curing agent, before and after curing. Moveover, from in particular pages 2–4 of said JP 6-145306 it was also known that the use of several earlier proposed specifically structured phenol resins as curing agents in epoxy resin compositions, could not meet the present requirements from the electronic industry.

Said improvement of final properties and processing properties of the presently provided epoxy resin compositions which meet the present requirements of the electronic industry, could certainly not be expected by average persons skilled in the art.

The present invention is illustrated by the following examples, however without restricting its scope to these specific embodiments.

Production examples of each component of the curing agent for epoxy resins of the present invention, examples of the curing agent for epoxy resins of the present invention, and examples and comparative examples of the epoxy resin composition of the present invention are given below.

Production Examples 1 to 4 of (A) Phenol Resin Having a Hydrocarbon Group with Small Polarity Between the Phenol Nuclei Phenol, cyclohexanone, 4,4'-dimethoxymethylbiphenyl, 2,6-dihydroxymethylnaphthalene or limonene and paratoluenesulfonic acid or tungstosilicic acid were charged into a 5-liter three-necked flask equipped with a thermometer, stirrer and cooling pipe in amounts shown in Table 1 and maintained at 120° C. for 10 hours to carry out a reaction. Subsequently, neutralization was carried out with caustic soda to stop the reaction, and unreacted phenol was completely distilled off under vacuum to obtain a crude phenol resin. Thereafter, the crude phenol resin was dissolved in methyl isobutyl ketone and washed in water to remove the reaction catalyst, or the like and methylisobutyl ketone was removed under vacuum to obtain a target phenol resin. The hydroxyl group equivalents and softening points of these phenol resins are shown in Table 1.

Production Example 5

A purified phenol resin was obtained from the phenol resin obtained in Production Example 4 by recrystallization using toluene as a solvent. The hydroxyl group equivalent and softening point of this phenol resin are shown in Table 1.

TABLE 1

|  |  | Production Examples | | | | |
|---|---|---|---|---|---|---|
|  |  | 1 | 2 | 3 | 4 | 5 |
| Phenol resin production conditions Quantity (g) | Phenol | 752 | 752 | 752 | 752 | |
|  | Cyclohexanone | 98 | — | — | 4 | |
|  | 4,4'-dimethoxymethyl-biphenyl | — | 484 | — | — | |
|  | 2,6-dihydroxymethyl-naphthalene | — | — | 564 | — | |
|  | Limonene | — | — | — | 272 | |
|  | Paratoluenesulfonic acid | 10 | 10 | 10 | — | |
|  | Tungstosilicic acid | — | — | — | 10 | |
| Properties of product | Hydroxyl group equivalent (g/eq.) | 140 | 205 | 196 | 171 | 162 |
|  | Softening point (° C.) | 61 | 73 | 82 | 81 | 94 |

Examples 1 to 6 of Curing Agent for Epoxy Resins

Each of the phenol resins of above Production Examples 1 to 5 or terpene phenol novolak resin as (a) the phenol resin having a hydrocarbon group with small polarity between the phenol nuclei, (b) a thiodiphenol compound and (c) a general phenol novolak resin as a polyphenol compound having a structure other than the components (a) and (b) were molten and mixed together in amounts shown in Table 2 to produce a curing agent for epoxy resins. The melt viscosity, hydroxyl group equivalent and softening point of the curing agent for epoxy resins are shown in Table 2.

TABLE 2

|  |  | Production Examples | | | | | |
|---|---|---|---|---|---|---|---|
|  |  | 1 | 2 | 3 | 4 | 5 | 6 |
| Production conditions of curing | Component (a) Production Example 1 | 75 | — | — | — | — | — |

TABLE 2-continued

|  |  | Production Examples | | | | | |
|---|---|---|---|---|---|---|---|
|  |  | 1 | 2 | 3 | 4 | 5 | 6 |
| agent for epoxy resins Parts by weight | Production Example 2 | — | 90 | — | — | — | — |
|  | Production Example 3 | — | — | 50 | — | — | — |
|  | Production Example 4 | — | — | — | 80 | — | — |
|  | Production Example 5 | — | — | — | — | 70 | — |
|  | Terpene diphenol novolak resin *1 | — | — | — | — | — | 45 |
|  | Component (b) bis(4-hydroxyphenyl) sulfide | 5 | 10 | — | — | 30 | 55 |
|  | Bis(4-hydroxy-3,5-dimethyl-phenol)sulfide | — | — | 10 | 20 | — | — |
|  | Component (c) phenol novolak resin *2 | 20 | — | 40 | — | — | — |
| Property values | Melt viscosity (150° C., P) | 1.0 | 1.1 | 1.8 | 0.7 | 0.4 | 0.9 |
|  | Hydroxyl equivalent (g/eq.) | 129 | 188 | 139 | 162 | 141 | 131 |
|  | Softening point (° C.) | 69 | 70 | 77 | 66 | 65 | 68 |

(notes)
*1 Japan Epoxy Resin Co., Ltd., trade name: Epicure MP402, hydroxyl group equivalent: 175 g/eq, softening point: 125° C.
*2 Gun-ei Kagaku Co., Ltd., trade name: Resitop PSM4261, hydroxyl group equivalent: 103 g/eq, softening point: 85° C.

Examples 7 to 12 and Comparative Examples 1 to 3 of Epoxy Resin Composition

As shown in Table 3, an epoxy resin derived from tetramethyl biphenol, epoxy resin derived from biphenol and tetramethyl biphenol or epoxy resin derived from an ortho-cresol novolak resin as the epoxy resin, the curing agent for epoxy resins produced in each of Examples 1 to 6, a general phenol novolak resin, the phenol resin of Production Example 2 or phenol resin of Production Example 6 as the curing agent for epoxy resins, an epoxy resin derived from tetrabromobisphenol A as a brominated epoxy resin, silica powder as an inorganic filler, triphenylphosphine as a curing accelerator, antimony trioxide as a flame retardant aid, epoxysilane as a coupling agent and carnauba wax as a release agent were used to compound an epoxy resin composition. Thereafter, the compound was molten and kneaded by a mixing roll at a temperature of 70 to 120° C. for 5 minutes. The obtained molten mixture was taken out in the form of a thin plate, cooled and ground to obtain a molding material. This molding material was molded into a test piece by a transfer molding machine at a mold temperature of 175° C. for 180 seconds and the test piece was post-cured at 180° C. for 8 hours. The spiral flow and hardness (at the time of releasing, in a heated state) of each molding material were measured, respectively, to find its fluidity and moldability, and the moisture absorption rate, elastic modulus and flame retardancy of each post-cured test piece were also measured. The results are shown in Table 3. Further, the solder crack resistance of a test-use semiconductor device encapsulated by each molding material was tested and its results are shown in Table 3.

Thereby, the molding materials of Examples 7 to 12 are superior in moldability (superior hardness at the time of releasing, in a heated state), inductivity (high spiral flow), moisture resistance (low moisture absorption) and low stress (low elastic modulus) properties as well as solder crack resistance to the molding materials of Comparative Examples 1 to 3. The molding materials of Examples 7 to 12 did not contain a harmful halogen-based flame retardant and yet had excellent flame retardancy.

continued at the same temperature for 10 minutes under agitation to obtain a polycondensation reaction product.

The reaction product was left to stand, the temperature was reduced to 95° C., and an unreacted raw material oil fraction which was separated as an upper layer was removed by decantation to obtain a crude modified phenol resin.

The obtained crude modified phenol resin was vacuum distilled at 190° C. until phenol did not distill out, and nitrogen was blown in at the same temperature to thermally decompose and eliminate oxalic acid and remove unreacted phenol.

100 ml of heavy naphtha was added to the thus obtained crude modified phenol resin and stirred at about 100° C. for

|  |  |  | Example |  |  |  |  |  | Comparative Example |  |  |
|---|---|---|---|---|---|---|---|---|---|---|---|
|  |  |  | 7 | 8 | 9 | 10 | 11 | 12 | 1 | 2 | 3 |
| Epoxy resin composition | Amount of epoxy resin |  | A *1 100 | B *2 100 | B 100 | A 100 | C *3 100 | C 100 | B 100 | B 100 | A 100 |
|  | Amount of brominated epoxy resin *6 |  | 0 | 0 | 0 | 0 | 0 | 0 | 0 | 0 | 8 |
|  | Amount of curing agent for epoxy resin |  | Example 1 61 | Example 2 98 | Example 3 72 | Example 4 77 | Example 5 82 | Example 6 77 | D *4 89 | Production example 2 107 | E *5 51 |
|  | Inorganic filler *7 |  | 926 | 1133 | 988 | 1015 | 1045 | 1012 | 1080 | 1183 | 966 |
|  | Triphenyl phosphine |  | 1 | 1 | 1 | 1 | 1 | 1 | 1 | 1 | 1 |
|  | Atimony trioxide |  | 0 | 0 | 0 | 0 | 0 | 0 | 0 | 0 | 9 |
|  | Carnauba wax |  | 1 | 1 | 1 | 1 | 1 | 1 | 1 | 1 | 1 |
|  | Silane coupling agent *8 |  | 1 | 1 | 1 | 1 | 1 | 1 | 1 | 1 | 1 |
| Test results | Moldability | Hardness at the time of releasing in heated state *9 | 88 | 75 | 84 | 87 | 77 | 83 | 68 | 55 | 84 |
|  | Fluidity | Spiral flow (cm) | 80 | 93 | 87 | 85 | 96 | 92 | 90 | 94 | 65 |
|  | Curing properties moisture absorption % *10 |  | 0.35 | 0.29 | 0.31 | 0.33 | 0.32 | 0.32 | 0.35 | 0.30 | 0.42 |
|  | Elastic modulus (kg/mm²) |  | 2100 | 1950 | 1980 | 2070 | 1880 | 1890 | 2160 | 2100 | 2340 |
|  | Solder crack resistance *11 |  | 0/16 | 0/16 | 0/16 | 0/16 | 0/16 | 0/16 | 3/16 | 0/16 | 16/16 |
|  | Flame retardancy *12 |  | V-0 | V-0 | V-0 | V-0 | V-0 | V-0 | Complete combustion | Complete combustion | V-0 |

(Notes)
The amounts are parts by weight.
*1 A; tetramethylbiphenol type epoxy resin (trade name of Japan Epoxy Resin Co., Ltd.: Epikote XY4000H, epoxy equivalent: 192 (g/eq.))
*2 B; cresol novolak type epoxy resin (trade name of Japan Epoxy Resin Co., Ltd.: Epikote 180S62 of, epoxy equivalent: 210 (g/eq.))
*3 C; phenol aralkyl resin (trade name of Meiwa Kasei Co., Ltd.: MEH-7800S, hydroxyl group equivalent: 175 (g/eq.), softening point: 74° C.)
*4 D; phenol novolak resin (trade name of Gun-ei Kagaku Co., Ltd.: Resitop PSM4261, hydroxyl group equivalent: 103 (g/eq.), softening point: 85° C.)
*5 brominated epoxy resin (trade name of Japan Epoxy Resin Co., Ltd.: Epikote 5050, epoxy equivalent: 385 (g/eq.), bromine content: 48%)
*6 spherical fused silica powder (trade name of Nippon Aerosil Co., Ltd.: ELSIL BF100)
*7 epoxysilane (trade name of Shinetsu Kagaku Kogyo Co., Ltd.: KBM-403)
*8 measured at Shore D
*9 moisture absorption at 85° C. and 85% RH after 300 hours.
*10 measured at 240° C.
*11 16 QFP's heated at 80° C. were caused to absorb moisture at 85° C. and 85% RH for 300 hours and immersed in a solder bath heated at 260° C. for 10 seconds to measure the number of formed cracks.
*12 UL94

Production examples 14 and 15 of each component of the curing agent for epoxy resins of the present invention, examples of the curing agent for epoxy resins of the present invention, and examples 21–25 and comparative examples of the epoxy resin composition of the present invention are given below.

Production examples 14 and 15 of modified phenol resin obtained by polycondensing a heavy oil or pitch, phenol and aldehyde compound in the presence of an acid catalyst as the component (a) used in the curing agent for epoxy resins.

100 g of raw material oil shown in Table 1, 83 g of phenol, 10.2 g of paraformaldehyde and 0.6 g of oxalic acid were charged into a 1-liter glass reactor and heated to 100° C. over 20 minutes under agitation at 250 to 350 rpm. A reaction was 30 minutes to extract unreacted raw material oil remaining in the resin. Thereafter, a heavy naphtha layer containing unreacted oil was removed by decantation.

The above series of unreacted oil extraction and removal operations using heavy naphtha was repeated three times under the same conditions. After the extraction operation, a trace amount of the residual heavy naphtha was removed by vacuum distillation to obtain a purified modified phenol resin.

The melt viscosity at 150° C., softening point, hydroxyl group equivalent and number average molecular weight of this modified phenol resin are shown in Table 1.

A modified phenol resin was produced in the same manner as Production Example 1 except that the addition amounts of phenol, paraformaldehyde and oxalic acid were changed and are shown in Table 1 as Production Example 15.

TABLE 4

| | | Production Example 14 | Production Example 15 |
|---|---|---|---|
| Properties of raw material oil | Type of oil | Oil at bottom of column of flow contact decomposition apparatus | |
| | Average molecular weight | 324 | |
| | Boiling point (° C.) | 310–510 | |
| | Aromatic hydrocarbon fraction fa value | 0.66 | |
| | Aromatic ring hydrogen content Ha value (%) | 25 | |
| Amount of charge | Raw material oil | 100 | 100 |
| | Phenol | 83 | 71 |
| | Paraformaldehyde | 10.2 | 15.1 |
| | Oxalic acid | 0.6 | 0.6 |
| Properties of resin | Melt viscosity at 150° C. | 1.7 | 20.1 |
| | Softening point (° C.) | 78 | 99 |
| | Hydroxyl group equivalent (g/eq.) | 167 | 151 |
| | Number average molecular weight Mn | 550 | 770 |

Examples 21 to 25 of Curing Agent for Epoxy Resins

The phenol resin of the above Production Example 14 and 15 as the modified phenol resin (a) obtained by polycondensing a heavy oil or pitch, phenol and aldehyde compound in the presence of an acid catalyst, the thiodiphenol compound (b) and a general phenol novolak resin or phenolaralkyl resin as the polyhydric phenol compound (c) having a structure other than the components (a) and (b) were molten and mixed together as shown in Table 5 to produce a curing agent for epoxy resins. The melt viscosity, hydroxyl group equivalent and softening point of the curing agent for these epoxy resins are shown in Table 5.

TABLE 5

| | | Example | | | | |
|---|---|---|---|---|---|---|
| | | 1 | 2 | 3 | 4 | 5 |
| Conditions for producing curing agent for epoxy resins | Component (a) production Example 14 | 95 | 70 | 30 | — | — |
| | Production Example 15 | — | — | — | 55 | 20 |
| | Component (b) bis(4-hydroxyphenyl) sulfide | 5 | 15 | — | — | 30 |
| | Bis(4-hydroxy-3, 5-dimethylphenyl) sulfide | — | — | 40 | 45 | — |
| | Component (c) phenol novolak resin *1 | — | 15 | — | — | — |
| | Phenolaralkyl resin *2 | — | — | 30 | — | 50 |
| Properties | Melt viscosity (150° C., P) | 1.5 | 1.2 | 0.8 | 2.5 | 1.8 |
| | Hydroxyl group equivalent (g/eq.) | 163 | 142 | 155 | 143 | 145 |
| | Softening point (° C.) | 75 | 72 | 65 | 80 | 76 |

(notes)
*1 Resitop PSM4261 of Gun-ei Kagaku Co., Ltd., hydroxyl group equivalent: 103 g/eq., softening point: 85° C.
*2 MEH-7800S of Meiwa Kasei Co., Ltd., hydroxyl group equivalent: 175 g/eq., softening point: 74° C.

Examples 26 to 30 and Comparative Examples x to z of Epoxy Resin Composition As shown in Table 6, an epoxy resin derived from tetramethyl biphenol or epoxy resin derived from an ortho-cresol novolak resin as the epoxy resin; the curing agent for epoxy resins produced in each of Examples 21 to 25, a general phenol novolak resin or a phenol aralkyl resin; an epoxy resin derived from tetrabromobisphenol A as a brominated epoxy resin; silica powder as an inorganic filler; triphenylphosphine as a curing accelerator; antimony trioxide as a flame retardant aid; epoxysilane as a coupling agent; and carnauba wax as a release agent were used to compound an epoxy resin composition. Thereafter, the compound was molten and kneaded with a mixing roll at a temperature of 70 to 120° C. for 5 minutes. The obtained molten mixture was taken out in the form of a thin plate, cooled and ground to obtain a molding material. This molding material was molded into test pieces by a low temperature transfer molding machine at a mold temperature of 175° C. for 180 seconds and the test pieces were post-cured at 180° C. for 8 hours. The heated state hardness at the time of releasing of each molding material and spiral flow were measured to find, respectively, its moldability and fluidity, and the moisture absorption rate, elastic modulus and flame retardancy of each post-cured test piece were measured. The results are shown in Table 6. Further, the solder crack resistance of semiconductor chips on a simulation semiconductor device encapsulated by each molding material was tested and its results are shown in Table 6.

Thereby, the molding materials of Examples 26 to 30 were superior in moldability (superior heated state hardness at the time of releasing), fluidity (high spiral flow), moisture resistance (low moisture absorption) and low stress properties (low elastic modulus) as well as solder crack resistance to the molding materials of Comparative Examples x to z. The molding materials of Examples 26 to 30 did not contain a harmful halogen-based flame retardant and had excellent flame retardancy.

TABLE 6

|  |  | Example | | | | | Comparative Example | | |
| --- | --- | --- | --- | --- | --- | --- | --- | --- | --- |
|  |  | 26 | 27 | 28 | 29 | 30 | x | y | z |
| Epoxy resin composition | | A *1 | A | B *2 | A | A | A | B | B |
|  | Amount of epoxy resin | 100 | 100 | 100 | 100 | 100 | 100 | 100 | 100 |
|  | Amount of brominated epoxy resin *5 | 0 | 0 | 0 | 0 | 0 | 0 | 0 | 8 |
|  | Amount of curing agent for epoxy resin | Example 1 | Example 2 | Example 3 | Example 4 | Example 5 | C *3 | D (*4) | D |
|  |  | 85 | 74 | 74 | 74 | 76 | 91 | 49 | 51 |
|  | Inorganic filler *6 | 1059 | 997 | 996 | 1000 | 1006 | 1094 | 604 | 682 |
|  | Triphenyl phosphine | 1 | 1 | 1 | 1 | 1 | 1 | 1 | 1 |
|  | Antimony trioxide | 0 | 0 | 0 | 0 | 0 | 0 | 0 | 9 |
|  | Carnauba wax | 1 | 1 | 1 | 1 | 1 | 1 | 1 | 1 |
|  | Silane coupling agent *7 | 1 | 1 | 1 | 1 | 1 | 1 | 1 | 1 |
| Test results | Moldability Heated state hardness at the time of releasing *8 | 78 | 83 | 88 | 87 | 85 | 68 | 82 | 84 |
|  | Fluidity Spiral flow (cm) | 94 | 90 | 83 | 89 | 92 | 90 | 69 | 65 |
|  | Curing properties moisture absorption % *9 | 0.34 | 0.37 | 0.37 | 0.33 | 0.31 | 0.35 | 0.52 | 0.50 |
|  | Elastic modulus (kg/mm$^2$) *10 | 12.1 | 14.5 | 16.7 | 15.4 | 19.2 | 25.3 | 72.4 | 75.3 |
|  | Solder crack resistance *11 | 0/16 | 0/16 | 0/16 | 0/16 | 0/16 | 3/16 | 16/16 | 16/16 |
|  | Flame retardancy *12 | V-0 | V-0 | V-0 | V-0 | V-0 | Complete combustion | Complete combustion | V-0 |

(Notes)
The amounts are parts by weight.
*1 A; tetramethylbiphenol type epoxy resin (trade name of Japan Epoxy Resin Co., Ltd.: Epikote XY4000H, epoxy equivalent: 192 (g/eq.))
*2 B; cresol novolak type epoxy resin (trade name of Japan Epoxy Resin Co., Ltd.: Epikote 180S62 of, epoxy equivalent: 210 (g/eq.))
*3 C; phenol aralkyl resin (trade name of Meiwa Kasei Co., Ltd.: MEH-7800S, hydroxyl group equivalent: 175 (g/eq.), softening point: 74° C.)
*4 D; phenol novolak resin (trade name of Gun-ei Kagaku Co., Ltd.: Resitop PSM4261, hydroxyl group equivalent: 103 (g/eq.), softening point: 85° C.)
*5 brominated epoxy resin (trade name of Japan Epoxy Resin Co., Ltd.: Epikote 5050, epoxy equivalent: 385 (g/eq.), bromine content: 48%)
*6 spherical fused silica powder (trade name of Nippon Aerosil Co., Ltd.: ELSIL BF100)
*7 epoxysilane (trade name of Shinetsu Kagaku Kogyo Co., Ltd.: KBM-403)
*8 measured at Shore D
*9 moisture absorption at 85° C. and 85% RH after 300 hours.
*10 measured at 240° C.
*11 16 QFP's heated at 80° C. were caused to absorb moisture at 85° C. and 85% RH for 300 hours and immersed in a solder bath heated at 260° C. for 10 seconds to measure the number of formed cracks.
*12 UL94

EFFECT OF THE INVENTION

Since the curing agent for epoxy resins and epoxy resin compositions of the present invention have a low melt viscosity, low moisture absorption and low stress properties and gives a cured product having excellent moldability, they can be advantageously used in an epoxy resin composition for semiconductor encapsulation.

What is claimed is:

1. A curing agent for epoxy resins, comprising:

(a) 30 to 99 parts by weight of a modified phenol resin which is obtained by polycondensing a heavy oil or pitch, a phenol and a carbonyl compound, which is an aldehylde having 5 to 15 carbon atoms or a ketone, in the presence of an acid catalyst, (b) 1 to 70 parts by weight of a thiodiphenol compound represented by the following general formula (II):

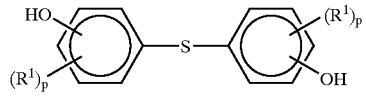

wherein $R_1$'s may be the same or different from each other and each represent an alkyl group having 1 to 12 carbon atoms, substituted or nonsubstituted phenyl group, substituted or nonsubstituted aralkyl group or alkoxy group, and p's may be the same or different from each other and each represent an integer of 0 to 3, and (c) 0 to 100 parts by weight of a polyhydric phenol compound having a structure other than the components (a) and (b).

2. The curing agent for epoxy resins of claim 1, characterized in that the modified phenol resin as the component (a) is obtained by mixing together a heavy oil or pitch, 0.3 to 10 mols of the phenol, 0.2 to 9 mols of the carbonyl compound having 5 to 15 carbon atoms and 0.01 to 3 mols of the acid catalyst based on 1 mol of the heavy oil or pitch calculated from its average molecular weight and heating to carry out a polycondensation reaction.

3. The curing agent for epoxy resins of claim 2, characterized in that the heavy oil or pitch has an aromatic hydrocarbon fraction Fa of 0.40 to 0.95 and an aromatic ring hydrogen content Ha of 20 to 80%.

4. The curing agent for epoxy resins of claim 3, wherein the heavy oil has a distillation start temperature of 170°C. or more.

5. The curing agent for epoxy resins of claim 1, wherein the modified phenol resin (a) has a hydroxyl group equivalent of 130 to 200 g/eq.

6. The curing agent for epoxy resins of claim 1, wherein at least one thiodiphenol is selected from the group consisting of bis(4-hydroxyphenyl)sulfide and, bis(4-hydroxy-3-methylphenyl)sulfide.

7. The curing agent for epoxy resins of claim 1, wherein the thiodiphenol compound (b) is bis(4-hydroxy-3,5-dimethylphenyl)sulfide.

\* \* \* \* \*